United States Patent [19]
Kwon et al.

[11] Patent Number: 5,187,020
[45] Date of Patent: Feb. 16, 1993

[54] COMPLIANT CONTACT PAD

[75] Inventors: Oh-Kyong Kwon, Richardson; Satwinder Malhi; Masahi Hashimoto, both of Garland, all of Tex.

[73] Assignee: Texas Instruments Incorporated, Dallas, Tex.

[21] Appl. No.: 745,994

[22] Filed: Nov. 5, 1991

Related U.S. Application Data

[63] Continuation of Ser. No. 560,936, Jul. 31, 1990, abandoned.

[51] Int. Cl.⁵ .................. B32B 15/08; H01R 4/58; G01R 3/00; H05K 1/18
[52] U.S. Cl. ..................... 428/601; 428/626; 428/901; 439/91; 439/908; 439/912; 324/158 P
[58] Field of Search ............... 357/67, 67 S, 68, 68 M; 439/66, 67, 68, 54, 91, 908, 912, 912.1; 324/158 F, 158 P; 428/601, 626, 901; 174/94 R, 96.3, 16.3

[56] References Cited

U.S. PATENT DOCUMENTS

| | | | |
|---|---|---|---|
| 4,851,153 | 7/1989 | Kono et al. | 428/901 |
| 4,885,126 | 12/1989 | Polonio | 174/16.3 |
| 4,902,857 | 2/1990 | Cranston et al. | 174/94 R |

Primary Examiner—Michael Lewis
Assistant Examiner—Valerie A. Lund
Attorney, Agent, or Firm—James C. Kesterson; Raymond E. Fritz, Jr.; Richard L. Donaldson

[57] ABSTRACT

A contact pad including a compliant, electrically conductive polymer is provided in a substrate. The contact pad may include a metallic base, and a metallic upper surface wherein said polymer is intermediate said base and upper surfaces. The pad also may have a recessed upper surface, or have a metallic bump thereon depending upon the specific use intended. The contact pad may be incorporated into a substrate including a base substrate material having an upper surface, an interconnecting layer on the upper surface, a dielectric layer on the interconnecting layer, and at least one compliant, electrically conductive polymeric contact pad extending through the dielectric layer and in contact with the interconnecting layer. The substrate so formed may be a temporary substrate used, for example, in testing of integrated circuit chips. The contact pads are manufactured on a substrate by metallizing the surface of a substrate to form an interconnect layer, coating the interconnect layer with a dielectric layer, patterning the sites of the contact pads on the dielectric layer to selectively expose metallic pad portions of the interconnect layer, and coating the exposed portions of the interconnect layer with a compliant, electrically conductive polymer. Alternatively, the manufacturing may include the steps of metallizing the surface of a substrate to form an interconnect layer, coating a polymer layer on the interconnect layer, defining a metal diffusion mask to establish a pattern for the pad, diffusing conductive metal into the layer as defined by the diffusion mask to provide regions of the polymer layer having metal diffused therein, and stripping the diffusion mask. The polymer may be either conductive or non-conductive when the coating step occurs.

4 Claims, 7 Drawing Sheets

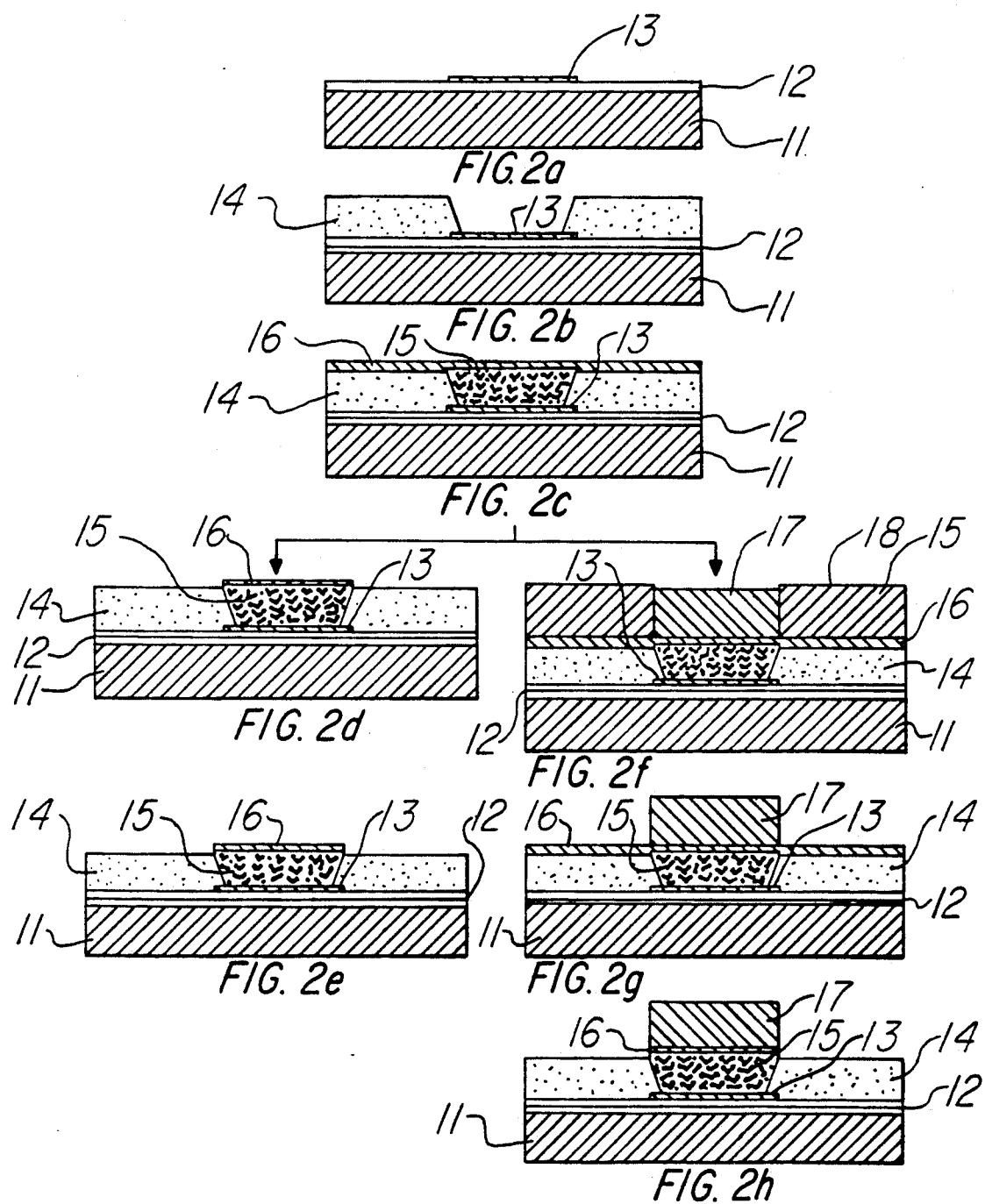

5,187,020

COMPLIANT CONTACT PAD

This application is a continuation of application Ser. No. 07/560,936 filed Jul. 31, 1990, now abandoned.

BACKGROUND OF THE INVENTION

The present invention relates generally to integrated circuits, and specifically to probing pads used for testing purposes in integrated circuits.

Integrated circuits typically have input and output pads which are used in testing as the electrical contact points at which probes can be placed to monitor performance of the integrated circuit during test procedures. Typically, such pads do not have a perfectly flat surface, or may include solder irregularities, or bumps, which tend to prevent or interfere with obtaining a good, solid electrical connection between the probes and the pads.

This problem is even more pronounced in testing applications in which multiple probes are applied to a plurality of pads on a chip during automatic testing. In high density multi-chip packaging technology, electrical probing for bare chip AC testing, burn-in testing and substrate testing, before assembly of the integrated circuit package are required in order to enhance manufacturing yield. If good electrical contact between the probes and the pads is not made during testing, erroneous test results may be obtained with the consequent rejection of otherwise properly performing integrated circuits. The yield of a particular manufacturing run of the integrated circuit in question is thereby lowered which, in turn, increases the cost of the integrated circuits.

An additional desirable requirement is that testing use a temporary substrate which can be used to verify the electrical functionality of integrated circuit chips without any chemical bonding between the pad of the integrated circuit chip and the pad of the temporary substrate, such as, for example, in initial multi-chip module defining stages of production of bread boards in print wiring board packages. The temporary substrate so utilized can also be used during any rework processing performed on integrated circuit chips which did not function properly during such preliminary stages of manufacture. In this situation as well there is a need for testing devices which can accommodate normally occurring variations in the contact structure of integrated circuits being tested to enhance the output yield.

SUMMARY OF THE INVENTION

One object of the present invention is to provide an integrated circuit contact pad which can be utilized in testing of such integrated circuits.

Another object of the present invention is to provide a compliant pad for integrated circuits.

Another object of the present invention is to provide a compliant pad constructed of a conductive polymer.

Another object of the present invention is to provide a pad for integrated circuits which can be used with temporary substrates during testing without chemical bonding of the pads.

Another object of the present invention is to provide a method of manufacturing compliant pads having the foregoing advantages.

The above and other objects of the invention are achieved by a contact pad including a compliant, electrically conductive polymer is provided in a substrate. The contact pad may include a metallic base, and a metallic upper surface wherein said polymer is intermediate said base and upper surfaces. The pad also may have a recessed upper surface, or have a metallic bump thereon depending upon the specific use intended. The contact pad may be incorporated into a substrate including a base substrate material having an upper surface, an interconnecting layer on the upper surface, a dielectric layer on the interconnecting layer, and at least one compliant, electrically conductive polymeric contact pad extending through the dielectric layer and in contact with the interconnecting layer. The substrate so formed may be a temporary substrate used, for example, in testing of integrated circuit chips. The contact pads are manufactured on a substrate by metallizing the surface of a substrate to form an interconnect layer, coating the interconnect layer with a dielectric layer, patterning the sites of the contact pads on the dielectric layer to selectively expose metallic pad portions of the interconnect layer, and coating the exposed portions of the interconnect layer with a compliant, electrically conductive polymer. Alternatively, the manufacturing may include the steps of metallizing the surface of a substrate to form an interconnect layer, coating a polymer layer on the interconnect layer, defining a metal diffusion mask to establish a pattern for the pad, diffusing conductive metal into the layer as defined by the diffusion mask to provide regions of the polymer layer having metal diffused therein, and stripping the diffusion mask. The polymer in this manufacturing method may be either conductive or non-conductive when the coating step occurs.

BRIEF DESCRIPTION OF THE DRAWINGS

The present invention will be described with reference to the accompanying drawings, wherein:

FIG. 2a–h is a flow diagram showing the process steps of the method of the present invention.

FIG. 6b is a top view of a substrate incorporating compliant pads constructed according to the present invention to be used in performing a test of the multi-chip module substrate of FIG. 6a.

DESCRIPTION OF THE PREFERRED EMBODIMENTS

Figure 1A:
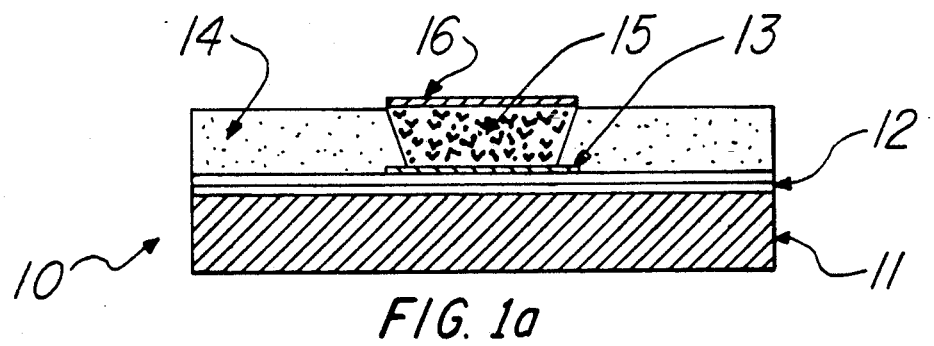
FIGS. 1a–c are cross sectional schematic views of alternative embodiments of compliant pads constructed according to the present invention.
Figure 1B:
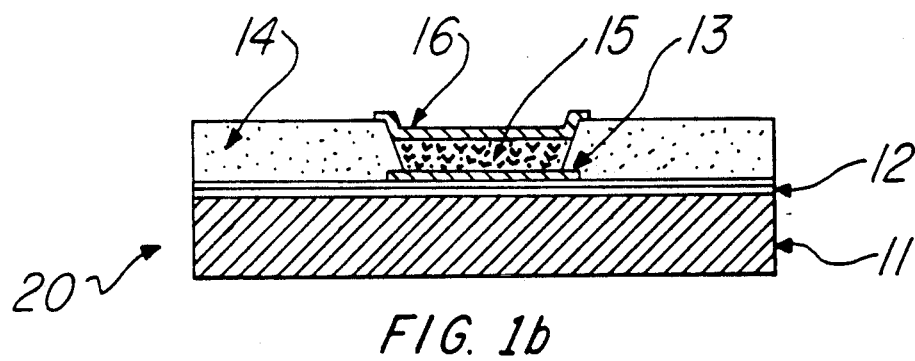
Figure 1C:
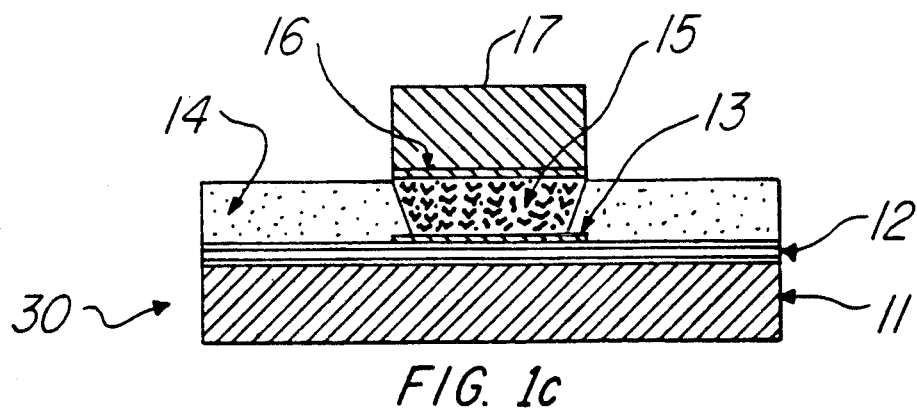

FIGS. 1a–c show in schematic form cross sectional views of the structure of compliant pads according to the present invention. Throughout the drawings, the same numerals are used to identify similar components of the devices described. The compliant pad 10 shown in FIG. 1a includes a substrate 11 on which the compliant pad is formed as described hereinafter with reference to FIGS. 2 and 3. The substrate 11 can be made of any suitable material such as silicon or ceramic material. On one surface, shown as the upper surface in the Figures, an interconnect layer 12 is present. Metal pad 13 is located at the area where the compliant pad is positioned. Metal pad 13 is positioned intermediate the surface of the interconnect layer 12 and the pad 15, which is comprised of an electrically conductive, compliant material, such as an electrically conductive polymer. On the surface of the interconnect layer 12 at areas where no pad 15 is located there is a relatively thick dielectric layer 14 of material, such as, for example, a hard baked polyimide. At the upper surface of the electrically conductive, compliant material 15 there is a contact layer 16, which may, for example, be a relatively thin layer of a conductive metal, such as gold, for contact with one or more contacts of an integrated circuit chip to be tested.

Electrically conductive compliant materials having sufficient spring-like properties, i.e. they can be adequately compressed to assure a good, solid electrical contact with a corresponding contact of an integrated circuit chip without permanent deformation of the compliant material, can be utilized as the material for the pad 15. For example, in testing applications of integrated circuit chips in which the maximum height variation is less than 5 um, a compliant polymer having the ability to be compressed approximately 5 um or slightly greater, should be adequate to obtain the proper contact between the compliant pad of the present invention and the contacts of the integrated circuit chip being tested. Preferably, the compliant polymer also should have a relatively low resistivity within the range of approximately 70 uohm-cm to 500 uohm-cm to obtain proper contact resistance. It should be apparent that the properties of the compliant material can vary depending upon the specific application in which the present invention is to be utilized.

The configuration of the compliant pad of the present invention also may vary to accommodate specific implementations. FIG. 1b shows an embodiment of the present invention in which the device 20 is identical to the device 10 shown in FIG. 1a with the exception that the compliant pad material 15 and the contact layer 16 are constructed to form an indented contact area with respect to the surface of the dielectric layer 14. This particular embodiment can be useful, for example, in applications requiring a reduction in the tendency of slippage between the contact of the integrated circuit chip and the contact pad of the present invention when pressure is applied during testing as hereinafter described. FIG. 1c shows another alternative embodiment of the present invention in which the device 30 is identical to the device 10 of FIG. 1a with the exception of the presence of protruding metal bump 17 at the contact surface 16 of the device 30. The particular form of the metal bump 17 is shown in FIG. 1c as being rectangular in cross-sectional shape, but it is to be understood that a variety of configurations can be used dependending upon the circumstances under which the device 30 is to be used.

Referring now to FIG. 2, there is shown the structure of the present invention at various steps in the manufacturing process according to the present invention. The initial step is metallizing the surface of a substrate 11 to form the interconnect layer 12. The metallizing step may produce multiple layers to form the interconnect layer and metal layer 13 depending upon the specific requirements of the application. Although a variety of substrates 11 may be used, it is generally preferable to use silicon because of its compatibility with other integrated circuit processes and its relative smoothness. After the substrate 11 is metallized the relatively thick dielectric layer 14, such as polyimide, is coated onto the interconnect layer 12. Preferably the dielectric layer 14 is baked at a low temperature and then patterned at the sites of the metal pads 13. After the metal pads 13 are exposed the device is baked at a relatively high temperature to harden the patterned dielectric layer 14. The compliant conductive polymer material 15 is then coated onto the top of metal pads 13, and preferably baked to cure the material 15. Metal is then deposited on the surface of the compliant material 15, a pattern is defined onto the metal over the locations of the compliant material 15, and etched so that the metal forms the contact layer 16. If the embodiment of the device using metal bumps 17 is desired, the process can be slightly altered. After the metal layer is deposited onto the compliant material 15, but before etching, the metal bump pattern is defined using, for example, photo resist material 18, and the metal bumps 17 are deposited, or plated, as thus defined. The photo resist 18 and metal layers are then stripped and etched to provide the embodiment of the invention having metal bumps 17.

Figures 3A, 3B, 3C, 3D, 3E, 3F:
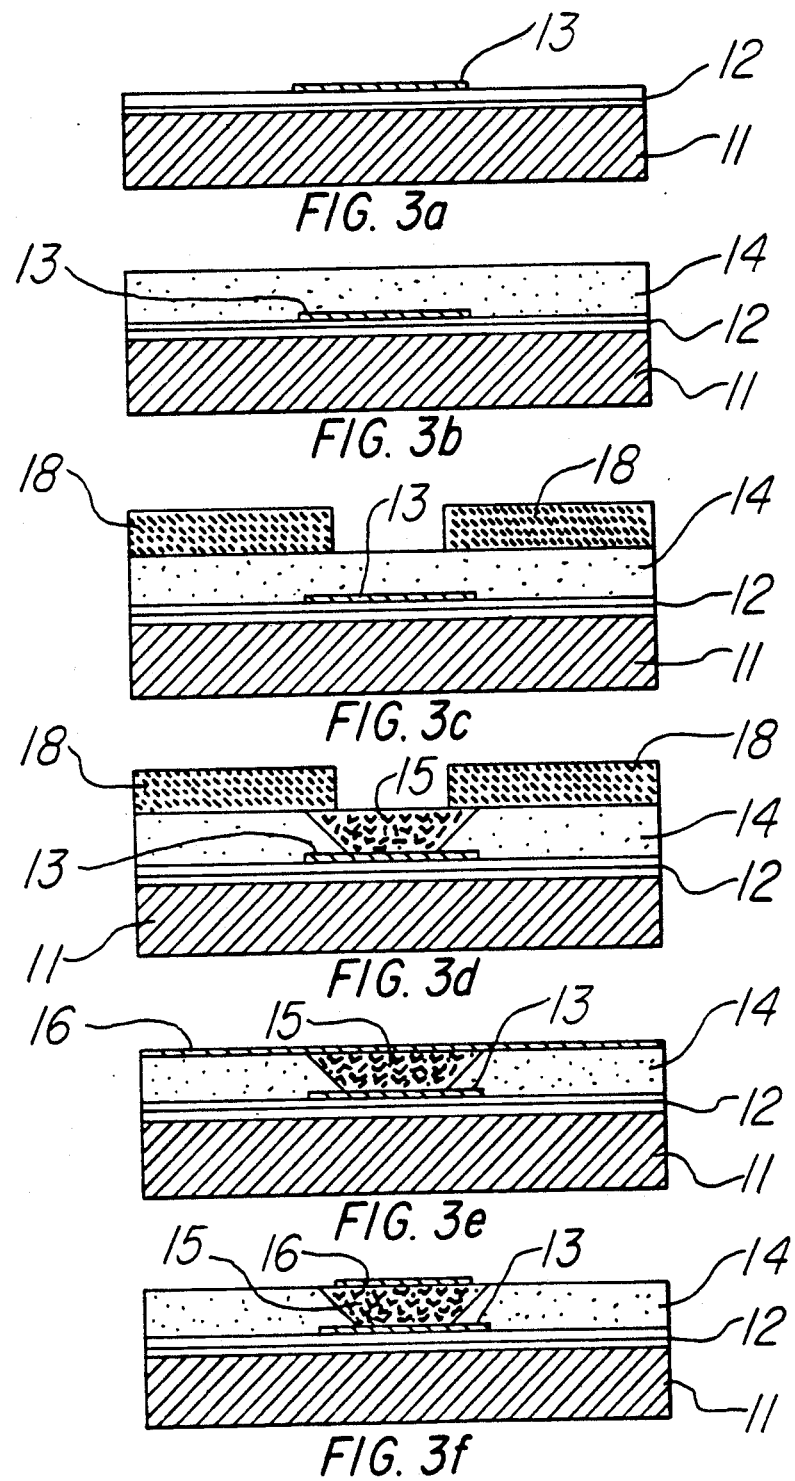
FIG. 3a–f is a flow diagram showing the steps of an alternative embodiment of the method of the present invention.

An alternative method of construction is now discussed with reference to FIG. 3, which shows the structure of the device of the present invention at various stages in the method of manufacture. The initial step is metallizing the surface of a substrate 11 to form the interconnect layer 12 and the metal contact pad 13. The surface is then coated with a polymer layer 14. The polymer layer 14 can be either a non-conductive polymer, or a conductive polymer if the metal concentration is greater then the percolation threshold concentration. Metal diffusion mask 18 is then defined on the surface exposing areas of the polymer layer 14 over the metal pad 13. Metal is then diffused into the polymer layer 14 to form the conductive, compliant pad 15. The diffusion mask 18 is then stripped away to expose the polymer layer 14 onto which is deposited a metal layer 16. The metal contact pattern is then defined, and etched to expose the metal contacts 16.

Figure 4:
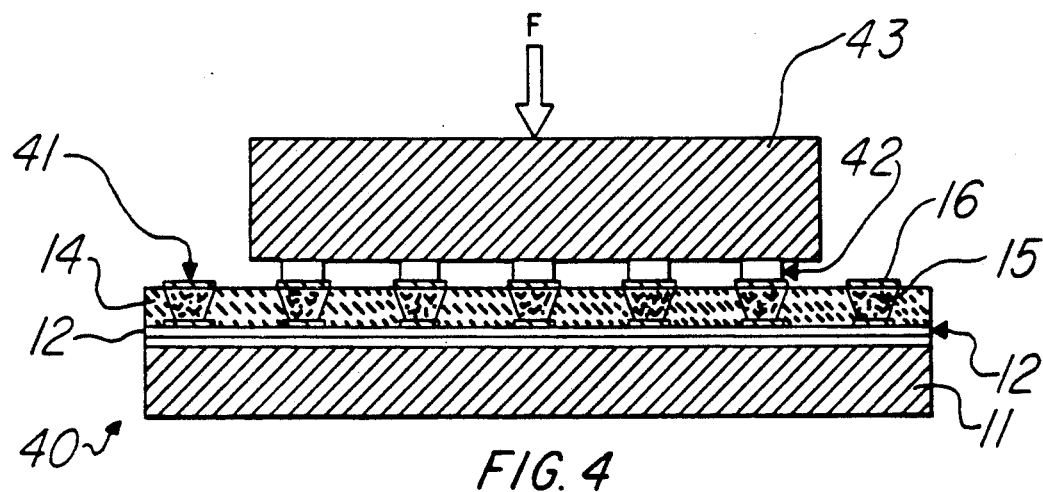
FIG. 4 is a cross sectional schematic view of a test substrate incorporating compliant pads constructed according to the present invention.

FIG. 4 shows the present invention implemented in a test substrate 40 which can be used, for example, to perform a burn-in/AC test of an integrated circuit chip 43. The area array bumps 42 of the integrated circuit chip 43 are aligned with compliant pads 15 on the substrate 11. Some of the compliant pads 41 can be utilized as output pads for probing during the test. A force F is applied to the chip 43 to enhance the contact made between the area array bumps 42 and the compliant pads 15.

Figure 5:
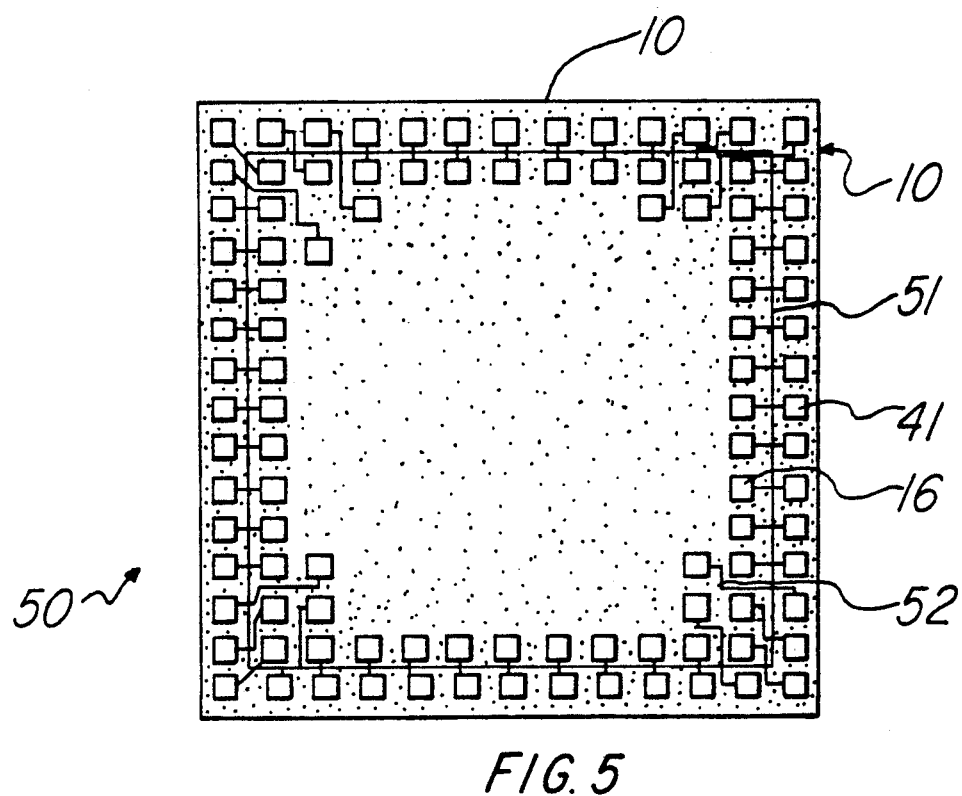
FIG. 5 is a top view of a burn-in AC test substrate incorporating compliant pads constructed according to the present invention.

FIG. 5 shows the top view of a typical test substrate 50 constructed in accordance with the present invention. The line 51 is shown to represent the area of the substrate 50 occupied by the integrated circuit chip being tested when it is positioned over the substrate 50. The contact pads 41 along the perimeter of the substrate 50 are therefore capable of being probed during testing of a chip. The metal pads 16 are arranged to correspond in alignment with some or all of the contacts of the chip to be tested. Interconnect lines 52 also may be provided on the substrate 50 to provide probing access to various contacts on the chip via compliant pad contacts 16 when the chip is positioned over the substrate 50 during testing.

Figure 6A:
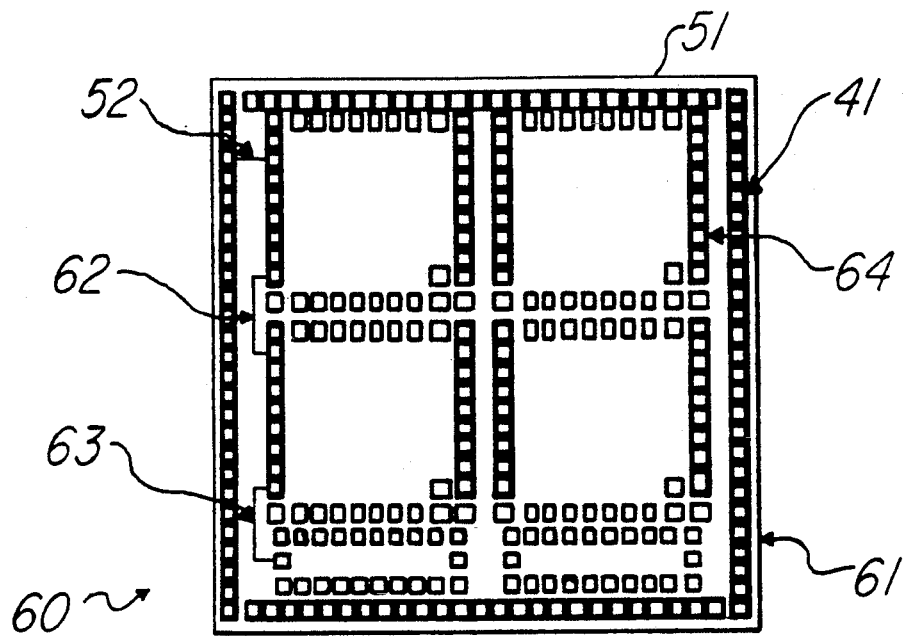
FIG. 6a is a top view of the substrate of a multi-chip module to be tested using the test substrate shown in FIG. 6b.
Figure 6B:
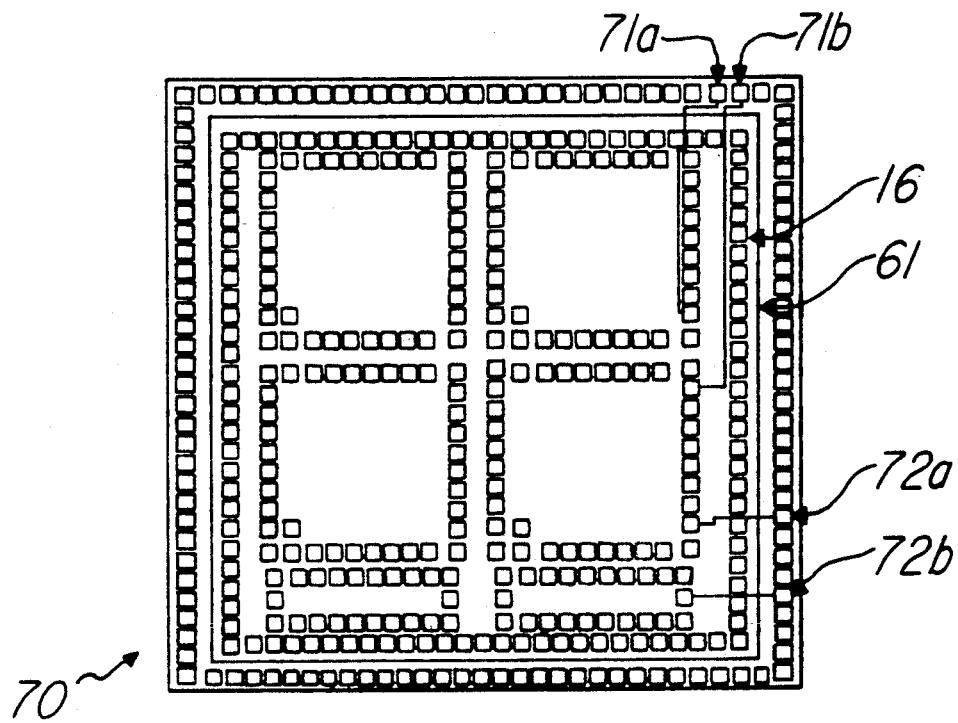

The present invention, referring now to FIGS. 6a and 6b, also can be implemented in the form of a substrate 70 used to test multi-chip modules, such as the multi-chip module 60 shown in FIG. 6a. The substrate 60 for multi-chip module to be tested has outer dimensions represented by perimeter 61. Around the edge of the perimeter 51 are located a plurality of output pads 41 which may be connected to internal pads 64 via interconnect lines 52. Internal networks also can be defined using interconnect lines 62 and 63, for example. When the multi-chip module 60 substrate is positioned over the test substrate 70 of FIG. 6b, the contact pads are aligned to correspond with the compliant contact pads 16 located on the test substrate 70. Test pads 71a and 71b can be utilized to test one of the internal networks, and test pads 72a and 72b can be used to test another of the internal networks of the multi-chip module 60. During testing the multi-chip module 60 would be pressed against the test substrate 70 by applying a force thereto.

Figure 7A:
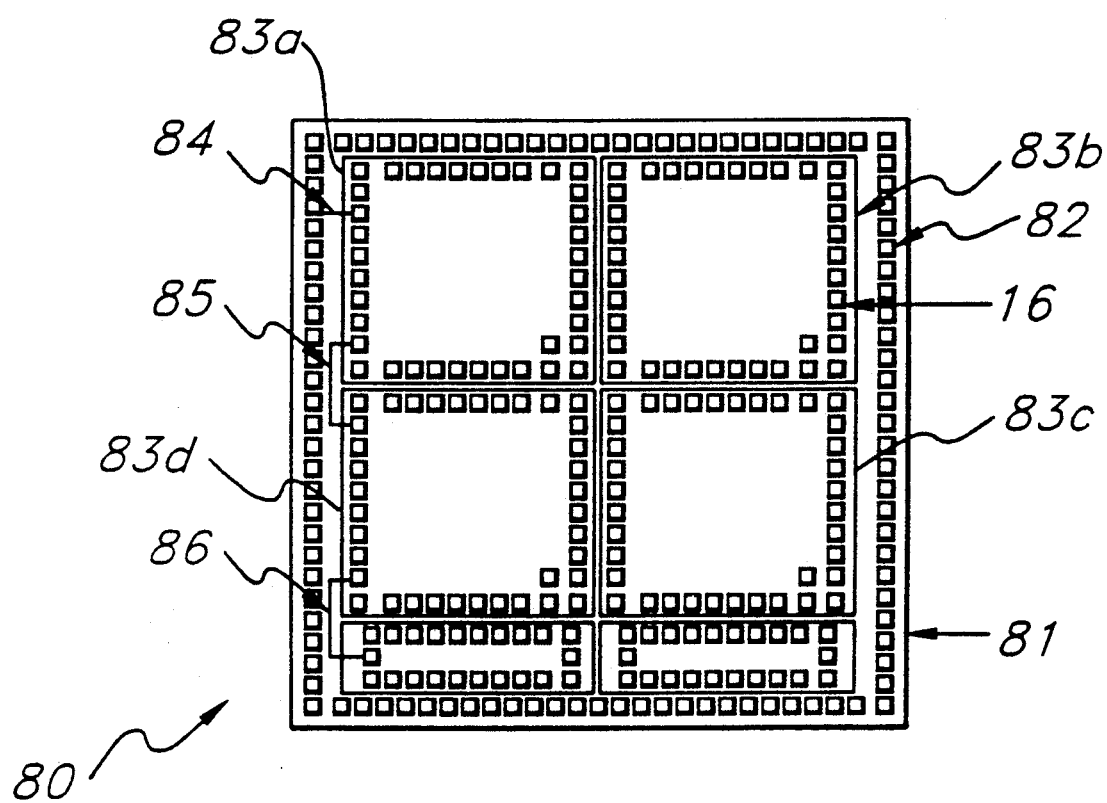
FIGS. 7a and 7b are top and cross sectional partial views, respectively, of an alternative embodiment of the present invention in a test substrate for simultaneously testing multiple integrated circuit devices.
Figure 7B:
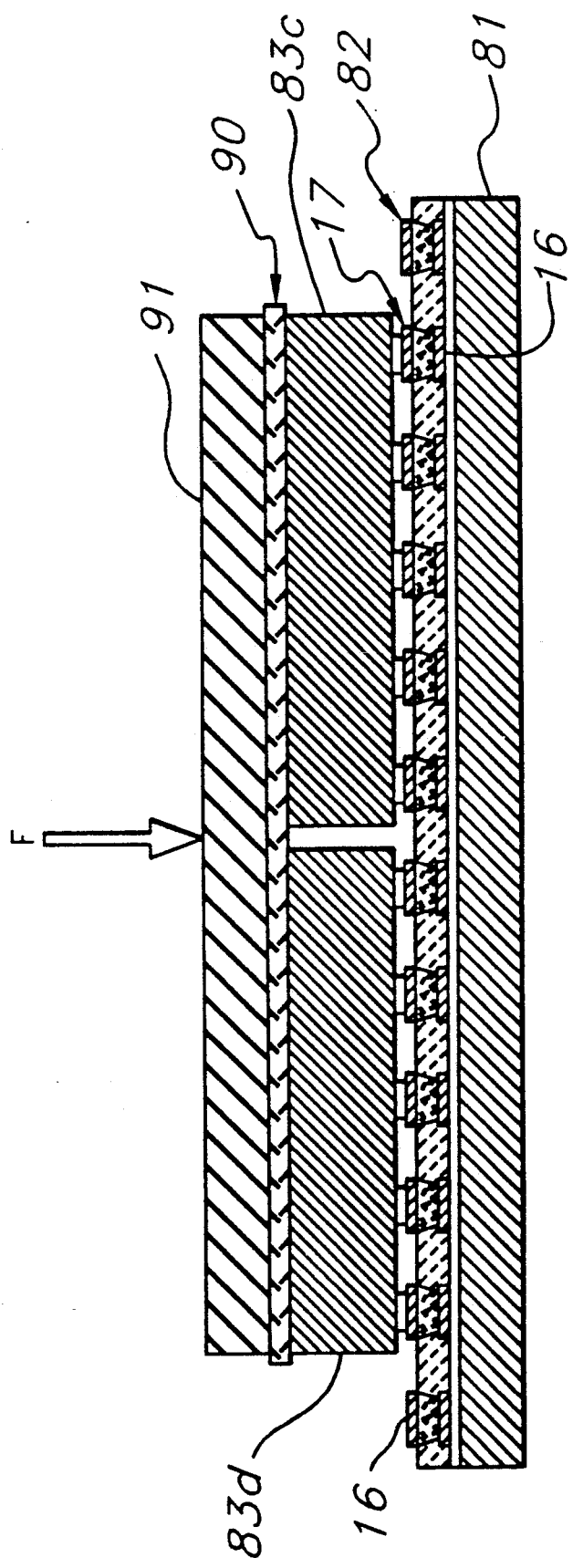

Referring now to FIGS. 7a and 7b, there is shown a temporary substrate 80 on which mulitple integrated circuit chips 83a-d can be positioned for use with performing tests on the chips 83a-d. The chips can be configured on the temporary substrate 80 using interconnect lines 84, 85 and 86, for example, as required to provide interconnections between chips, or to provide interconnection with the output pads 82. During testing, the chips 83c and 83d are aligned with the pads 16 on the temporary substrate 81 and pressed toward each other to make electrical contact by applying a force F to the surface of a solid material pressure plate 91. The testing can be facilitated by interposing a layer of compliant material 90 between the chips 83c-d and the solid material pressure plate 91 to which the force F is applied, thereby allowing simultaneous testing of chips 83c-d having varying thicknesses.

Although the invention has been described herein with reference to its preferred embodiment, it is to be understood that this description is by way of example only, and is not to be construed in a limiting sense. It is to be further understood that numerous changes in the details of the embodiment of the invention, and additional embodiments of the invention, will be apparent to, and may be made by, persons of ordinary skill in the art having reference to this description. It is contemplated that such changes and additional embodiments are within the spirit and scope of the invention as claimed below.

What is claimed is:

1. A plurality of contact pads comprising:
    a base substrate having an upper surface;
    an electrically conductive interconnecting layer formed on said upper surface;
    a plurality of metallic pads contacting said interconnecting layer;
    a dielectric layer covering said interconnecting layer;
    a plurality of compliant, electrically conductive polymeric contact pads, each of said polymeric contact pads extending through said dielectric layer and one each of said polymeric contact pads on top of and in contact with one each of said plurality of metallic pads; and
    a plurality of metallic contacts, one each of said plurality of metallic contacts covering an upper surface of one each of said polymeric contact pads.

2. A substrate having a plurality of contact pads for testing integrated circuit chips comprising:
    a substrate defining an upper surface;
    an electrically conductive interconnecting layer formed on said upper surface;
    a plurality of metallic pads contacting said interconnecting layer;
    a dielectric layer formed over said interconnecting layer; and
    a plurality of compliant, electrically conductive contact pads extending through said dielectric layer, one each of said contact pads on top of and in electrical contact with one each of said plurality of metallic pads; and
    a plurality of metallic contacts, one each of said plurality of metallic contacts covering an upper surface of one each of said compliant, electrically conductive contact pads.

3. The substrate for testing integrated circuit chips as defined in claim 2, wherein said contact pad further comprises:
    a metallic bump on said upper surface.

4. The substrate for testing integrated circuit chips as defined in claim 2, wherein said upper surface is recessed.

* * * * *